United States Patent
Hirahara et al.

(10) Patent No.: US 8,320,099 B2
(45) Date of Patent: Nov. 27, 2012

(54) ELECTROSTATIC CHUCK ELECTRICAL BALANCING CIRCUIT REPAIR

(75) Inventors: Robert T. Hirahara, San Jose, CA (US); Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/297,203

(22) Filed: Nov. 15, 2011

(65) Prior Publication Data

US 2012/0124819 A1    May 24, 2012

Related U.S. Application Data

(62) Division of application No. 12/205,428, filed on Sep. 5, 2008, now Pat. No. 8,064,185.

(51) Int. Cl.
*H01L 21/683* (2006.01)
*H01T 23/00* (2006.01)

(52) U.S. Cl. .......................... 361/234; 279/128

(58) Field of Classification Search ............. 361/234; 279/128
See application file for complete search history.

(56) References Cited

U.S. PATENT DOCUMENTS

| | | | |
|---|---|---|---|
| 5,542,559 A * | 8/1996 | Kawakami et al. | 216/67 |
| 5,644,467 A * | 7/1997 | Steger et al. | 361/234 |
| 5,656,093 A | 8/1997 | Burkhart et al. | |
| 5,908,334 A | 6/1999 | Chen et al. | |
| 6,081,414 A * | 6/2000 | Flanigan et al. | 361/234 |
| 6,462,928 B1 | 10/2002 | Shamouilian et al. | |
| 6,535,372 B2 | 3/2003 | Parkhe et al. | |
| 6,625,003 B2 * | 9/2003 | Loo et al. | 361/234 |
| 6,853,533 B2 * | 2/2005 | Parkhe | 361/234 |
| 6,875,927 B2 * | 4/2005 | Brown et al. | 174/110 R |
| 7,364,624 B2 * | 4/2008 | Mariner et al. | 118/725 |
| 8,064,185 B2 | 11/2011 | Hirahara et al. | |
| 2002/0050246 A1 * | 5/2002 | Parkhe | 118/500 |
| 2002/0185487 A1 * | 12/2002 | Divakar et al. | 219/444.1 |
| 2003/0169553 A1 * | 9/2003 | Brown et al. | 361/234 |
| 2007/0049043 A1 * | 3/2007 | Muthukrishnan et al. | 438/758 |
| 2008/0179005 A1 * | 7/2008 | Sagae et al. | 156/345.28 |

OTHER PUBLICATIONS

Office Action dated May 11, 2011 for Korean Patent Application No. 10-2009-0083974.

* cited by examiner

*Primary Examiner* — Rexford Barnie
*Assistant Examiner* — Christopher Clark
(74) *Attorney, Agent, or Firm* — Patterson & Sheridan, LLP

(57) ABSTRACT

The present invention includes methods and apparatus for repairing an electrical connection between bipolar electrodes contained within an electrostatic chuck and a conductive mask disposed atop the electrostatic chuck, known as a balancing circuit. Embodiments of the invention are particularly useful after removal of an electrostatic chuck for refurbishment.

9 Claims, 2 Drawing Sheets

ELECTROSTATIC CHUCK ELECTRICAL BALANCING CIRCUIT REPAIR

CROSS REFERENCE TO RELATED APPLICATIONS

This application is a divisional application of U.S. patent application Ser. No. 12/205,428, filed Sep. 5, 2008 now U.S. Pat. No. 8,064,185, which is incorporated by reference in its entirety.

BACKGROUND OF THE INVENTION

1. Field of the Invention

Embodiments of the present invention generally relate to apparatus and methods for repairing a severed electrical connection in the balancing circuit of an electrostatic chuck.

2. Description of the Related Art

In substrate processing equipment, an electrostatic chuck is commonly used for clamping a substrate to a pedestal during processing. The electrostatic chuck clamps the substrate by creating an attractive force between the substrate and the chuck. A voltage is applied to one or more electrodes in the chuck to induce oppositely polarized charges in the substrate and the electrodes, respectively. The opposite charges pull the substrate against the chuck, thereby retaining the substrate.

In a bipolar, electrostatic chuck, a chuck body has a pair of coplanar electrodes embedded therein. Each electrode is respectively connected to a terminal of a dual power supply having a common terminal, which is referred to as a center tap. The center tap is connected to a substrate spacing mask provided on the surface of the chuck in order to balance any variations in the impedance between the substrate and the electrodes. Thus, a constant electrostatic attraction force between the substrate and the chuck is maintained across the surface of the chuck.

The electrical connection between the center tap and the substrate spacing mask is often made through the conductive wall of a gas conduit used to supply gas to the backside of the substrate during processing. The gas conduit is attached to a metalized central bore within the chuck body. This connection works well during substrate processing, but the conductive connection is sometimes disrupted or otherwise compromised during the process of removing and refurbishing the electrostatic chuck assembly.

Therefore, a need exists for apparatus and methods of restoring a compromised balancing circuit electrical connection in an electrostatic chuck assembly.

SUMMARY OF THE INVENTION

In one embodiment of the present invention, a substrate support assembly comprises an electrostatic chuck having an electrode embedded therein and having an aperture disposed therethrough, a conductive liner disposed on the surface of the electrostatic chuck within the aperture, a conductive tubing extending from a lower surface of the electrostatic chuck and axially aligned with the aperture, and a conductive insert at least partially within the aperture and at least partially within the conductive tubing. In one embodiment, the conductive insert provides a conductive path between the conductive liner and the conductive tubing.

In one embodiment, a method for repairing a severed electrical connection within a balancing circuit of an electrostatic chuck assembly comprises determining the resistance between a substrate spacing mask disposed on the upper surface of an electrostatic chuck and a conductive tubing extending from the lower surface of the electrostatic chuck and axially aligned with a metallically lined aperture extending through the electrostatic chuck, evaluating the determined resistance to determine whether the electrical connection between the conductive conduit and the substrate mask has been severed, and repairing the severed connection by restoring a conductive path between the conductive tubing and the substrate spacing mask by using a welding technique to re-melt and re-fuse conductive material located between the metallically lined aperture and the conductive tubing. In one embodiment, the welding technique is selected from the list consisting of electron beam welding, laser welding, and micro plasma welding.

In one embodiment, a method for repairing a severed electrical connection within a balancing circuit of an electrostatic chuck assembly comprises determining the resistance between a substrate spacing mask disposed on the upper surface of an electrostatic chuck and a conductive tubing extending from the lower surface of the electrostatic chuck and axially aligned with a metallically lined aperture extending through the electrostatic chuck, evaluating the determined resistance to determine whether the electrical connection between the conductive conduit and the substrate mask has been severed, and placing a conductive insert into the aperture to repair the severed connection and restore a conductive path between the conductive tubing and the substrate spacing mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention includes methods and apparatus for testing and repairing an electrical connection between bipolar electrodes contained within an electrostatic chuck and a conductive mask disposed atop the electrostatic chuck, particularly after removal of the electrostatic chuck. This connection is known as a balancing circuit because it balances the electrostatic forces applied to a substrate positioned atop the electrostatic chuck.

In one embodiment, the electrostatic chuck is tested to determine whether the balancing circuit electrical connection has been disrupted. In one embodiment, if the electrical connection has been disrupted, the electrical connection is repaired via a welding process. In one embodiment, if the electrical connection has been disrupted the electrical connection is repaired with a conductive insert.

Figure 1:
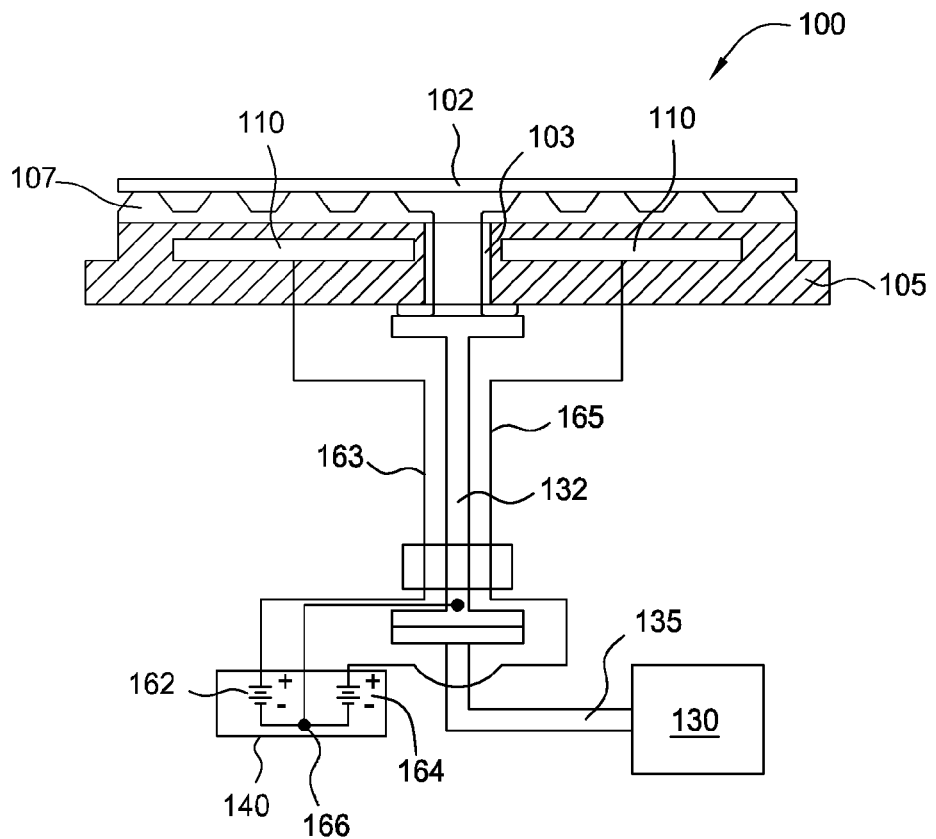
FIG. 1 is a schematic, cross-sectional view of an exemplary substrate support assembly, which may benefit from the present invention.

FIG. 1 is a schematic, cross-sectional view of an exemplary substrate support assembly 100, which may benefit from the present invention. The substrate support assembly 100 includes an electrostatic chuck 105 for supporting and retaining a substrate 102 during processing.

The electrostatic chuck 105 has a substrate spacing mask 107 disposed on the upper surface thereof. The substrate spacing mask 107 may comprise a material such as titanium, titanium nitride, or diamond-like carbon, and the like. The spacing mask 107 is deposited to a pre-defined thickness that maintains the substrate 102 slightly above the surface of the electrostatic chuck 105. The electrostatic chuck 105 further contains a conductive passage 103 disposed therethrough. In one embodiment, the conductive passage 103 has a conductive coating, such as copper silver solder material, that electrically couples the spacing mask 107 to the bottom region of the electrostatic chuck 105.

In one embodiment, a heat transfer fluid is transported from a gas source 130 to a conductive gas conduit 132 through a gas conduit 135. The conductive gas conduit 132 is mechanically and electrically coupled to the conductive passage 103, such as by brazing. In one embodiment, the conductive gas conduit 132 is conductive tubing, such as stainless steel tubing. In one embodiment, the conductive gas conduit is axially aligned with the conductive passage 103. Heat transfer fluid is transported through the conductive gas conduit 132 to the passage 103 extending through the electrostatic chuck 105. The gas is further transported through the conductive passage 103 to the backside of the substrate 102. The flow of gas may provide heating or cooling to the backside of the substrate 102. The heat transfer gas may be helium, argon, hydrogen, carbon tetrafluoride, or the like.

The electrostatic chuck 105 includes one or more chucking electrodes 110 embedded therein. The electrodes 110 are fabricated from a conductive material, such as tungsten, graphite, copper, or the like. The chucking electrodes 110 are disposed in an upper region of the electrostatic chuck 105 to provide the necessary electrostatic force to retain the substrate 102. The electrodes 110 may be configured in any manner necessary to retain the substrate 102. However, the embodiment depicted in FIG. 1 is a bipolar configuration.

The electrodes 110 are connected to a power supply 140 comprising a pair of dual terminal DC voltage supplies 162 and 164 with a center tap 166. The cathode on the voltage supply 162 is coupled to one of the bipolar electrodes 110 via an electrode lead 163, and the anode from the other voltage supply 164 is coupled to the other bipolar electrode 110 via an electrode lead 165. The cathode of the voltage supply 164 is coupled to the anode of the voltage supply 162 with a center tap 166 coupled therebetween. The center tap 166 is further coupled to the spacing mask 107 via the conductive gas conduit 132 and the conductive passage 103. As such, variations in the electrostatic force due to physical variations in the distance between the substrate 102 and the electrode 110 may be balanced. Therefore, changes in the electrostatic force are balanced by having the center tap 166 of the power supply 140 coupled to the spacing mask 107 in a balancing circuit.

Periodic service and maintenance of the substrate support assembly 100 is required during the lifetime of a processing chamber housing the electrostatic chuck 105. Accordingly, the electrostatic chuck 105 may be periodically removed from its processing chamber for refurbishing.

However, it has been discovered that the electrical connection between the conductive gas conduit 132 and the conductive passage 103 may become severed during removal of the electrostatic chuck 105. Thus, the balancing circuit between the spacing mask 107 and the electrodes 110 is rendered non-functional.

One embodiment for repairing a severed electrical connection in the balancing circuit of the substrate support assembly 100 involves first testing the assembly to detect whether the connection has been severed and then repairing the severed connection through the use of various techniques and/or devices. First, the substrate support assembly is tested to determine whether the electrical connection between the conductive gas conduit 132 and the conductive passage 103 has been disrupted. In one embodiment, the resistance across the connection may be tested via an ohmmeter. If the resistance is equal to or less than a specified resistance, the connection is intact. If the resistance is greater than the specified resistance, the connection must be repaired. In one embodiment, the specified resistance is 200 kΩ. Next, the connection is repaired.

Figure 2:
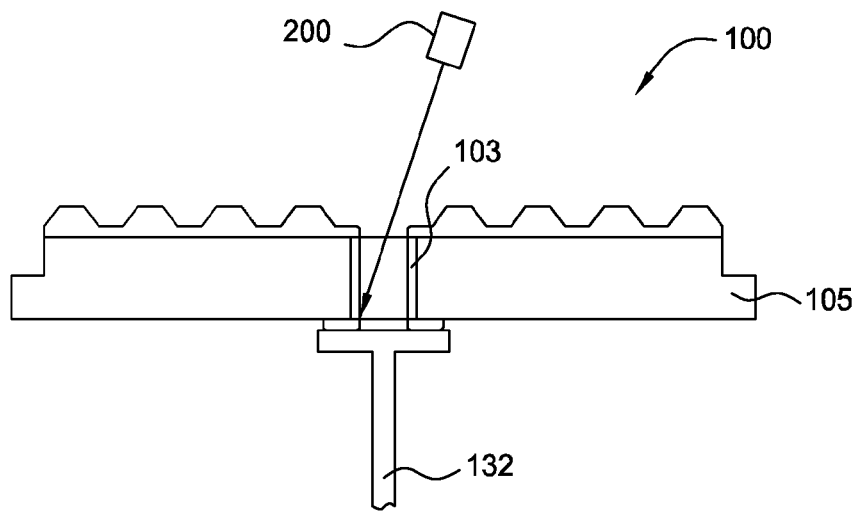
FIG. 2 is a schematic depiction of a substrate support assembly utilizing a method of repairing a severed electrical connection between a conductive gas conduit and a conductive passage according to one embodiment of the present invention.

FIG. 2 is a schematic depiction of a method of repairing the connection between the conductive gas conduit 132 and the conductive passage 103 according to one embodiment of the present invention. In one embodiment, the connection is repaired by electron beam welding 200 the connection to re-melt and re-fuse the braze material used in the connection. Alternatively, laser welding or micro plasma welding may be used to re-melt and re-fuse the braze material used in the connection. In one embodiment, conductive filler material is added during the welding. In another embodiment, a conductive preform is added during the welding.

Electron beam welding 200 is a fusion welding process in which a beam of high-velocity electrons is applied to materials being joined. The workpieces melt as the kinetic energy of the electrons is transformed into heat upon impact, and filler metal, if used, also melts to form part of the weld. Because the electron beam is tightly focused, the total heat input is actually much lower than that of any arc welding process. As a result, the effect of welding on the surrounding material is minimal, and the heat-affected zone is small. Distortion is slight, and the workpiece cools rapidly. Thus, electron beam welding may be used to re-melt and re-fuse the severed braze material at the connection between the conductive gas conduit 132 and the conductive passage 103 with minimal effect on the electrostatic chuck 105.

Figure 3:
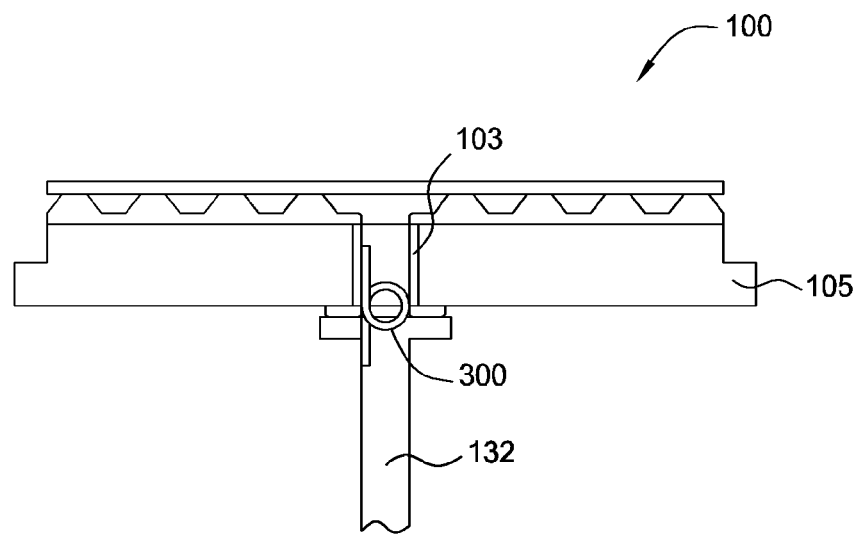
FIG. 3 is a schematic, cross-sectional view of a substrate support assembly utilizing a method of repairing a severed electrical connection between a conductive gas conduit and a conductive passage according to another embodiment of the present invention.

FIG. 3 is a schematic, cross-sectional view of the substrate support assembly utilizing another method of repairing the severed electrical connection between the conductive gas conduit 132 and the conductive passage 103 according to another embodiment of the present invention. A conductive insert 300 is disposed within the conductive passage 103 and spanning the connection between the gas conduit 132 and the conductive passage 103. The conductive insert 300 is positioned such that conductive contact is made between the conductive passage 103 and the conductive insert 300 as well as between the interior of the conductive gas conduit 132 and the conductive passage 103 via the conductive path provided by the conductive insert 300.

Figure 4:
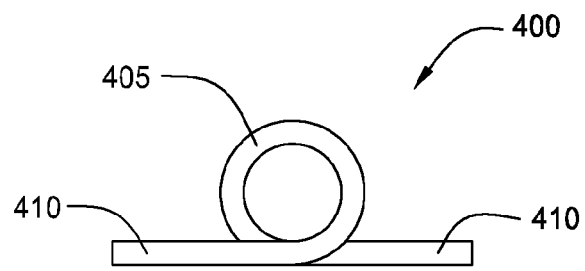
FIG. 4 is a side view of a "butterfly" spring used in one embodiment of the present invention.

In one embodiment, the conductive insert 300 is a "butterfly" spring 400, a schematic depiction of which is shown in FIG. 4. The butterfly spring 400 may comprise a torsion spring portion 405 with end portions 410 extending therefrom. In one embodiment, the butterfly spring 400 may comprise a conductive wire, such as nickel containing iron alloys, superalloys, or copper wire, helically coiled as shown in FIG. 4. In one embodiment, the conductive wire is operable at a temperature range from about 100° C. to about 500° C. The end portions 410 may be helically compressed and inserted into the conductive passage as shown in FIG. 3 such that when released, the end portions make electrical contact between the conductive gas conduit 132 and the conductive passage 103.

Figure 5:
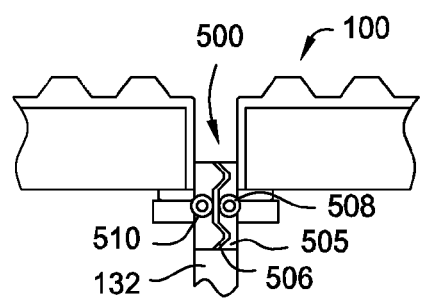
FIG. 5 is a schematic, cross-sectional view of a substrate support assembly comprising another embodiment of the present invention.

FIG. 5 is an enlarged, schematic, cross-sectional, partial view of the substrate support assembly 100 comprising another embodiment of a conductive insert 500. The conductive insert 500 comprises a plug member 505 with a canted coil spring 510 positioned thereabout. The canted coil spring 510 comprises a conductive material, such as stainless steel. The plug member 505 may be comprised of a non-metallic material, such as quartz, having one or more gas passages 506 disposed therethrough. In one embodiment the gas passages 506 may be configured at one or more non-perpendicular angles with respect to the top and bottom surfaces of the plug 505. In one embodiment, the plug 505 may have an annular groove 508 circumscribing the plug 505. The canted coil spring 510 may be configured around the plug 505 and at least partially disposed within the annular groove 508.

In order to repair the connection between the conductive gas conduit 132 and the conductive passage 103, the conductive insert 500 may be inserted into the conductive passage 103, wherein the conductive canted coil spring 510 makes electrical contact with both the conductive gas conduit 132 an the conductive passage 103. Thus, the balancing circuit of the substrate support assembly 100 is restored by the conductive insert 500, which provides a path for electrical current between the conductive gas conduit 132 and the conductive passage 103.

While the foregoing is directed to embodiments of the present invention, other and further embodiments of the invention may be devised without departing from the basic scope thereof, and the scope thereof is determined by the claims that follow.

The invention claimed is:

1. A method for repairing a severed electrical connection within a balancing circuit of an electrostatic chuck assembly, comprising:

determining the resistance between a substrate spacing mask disposed on the upper surface of an electrostatic chuck and a conductive tubing extending from the lower surface of the electrostatic chuck and axially aligned with a metallically lined aperture extending through the electrostatic chuck;

evaluating the determined resistance to determine whether the electrical connection between the conductive tubing and the substrate mask has been severed; and repairing the severed connection by restoring a conductive path between the conductive tubing and the substrate spacing mask by using a welding technique to re-melt and re-fuse conductive material located between the metallically lined aperture and the conductive tubing, wherein the welding technique is selected from the list consisting of electron beam welding, laser welding, and micro plasma welding.

2. A method for repairing a severed electrical connection within a balancing circuit of an electrostatic chuck assembly, comprising:

determining the resistance between a substrate spacing mask disposed on the upper surface of an electrostatic chuck and a conductive tubing extending from the lower surface of the electrostatic chuck and axially aligned with a metallically lined aperture extending through the electrostatic chuck;

evaluating the determined resistance to determine whether the electrical connection between the conductive tubing and the substrate mask has been severed; and placing a conductive insert into the aperture to repair the severed connection and restore a conductive path between the conductive tubing and the substrate spacing mask.

3. The method of claim 2, wherein the conductive insert comprises a conductive spring.

4. The method of claim 3, wherein the conductive spring comprises a torsion spring having an elongated portion at each end, wherein one elongated portion is electrically coupled to the conductive tubing and the other elongated portion is electrically coupled to the metallically lined aperture.

5. The method of claim 2, wherein the conductive insert comprises:

a non-metallic plug having an aperture formed therethrough and having a groove circumscribing the plug; and a conductive spring at least partially disposed within the groove.

6. The method of claim 5, wherein the conductive spring provides a conductive path between the metallically lined aperture and the conductive tubing.

7. The method of claim 6, wherein the nonmetallic plug comprises quartz and the conductive spring is a canted coil spring.

8. The method of claim 2, wherein the determining further comprises measuring the resistance between the spacing mask and the conductive tubing via an ohmmeter.

9. The method of claim 8, wherein the evaluating further comprises determining whether the resistance exceeds 200 kΩ.

* * * * *